United States Patent
Yang et al.

(10) Patent No.: US 6,316,330 B1
(45) Date of Patent: Nov. 13, 2001

(54) METHOD OF FABRICATING A SHALLOW TRENCH ISOLATION SEMICONDUCTOR DEVICE

(75) Inventors: Gwo-Shii Yang, Hsinchu; Tri-Rung Yew, Hsinchu Hsien; Coming Chen, Taoyuan Hsien; Water Lur, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/699,110

(22) Filed: Oct. 26, 2000

Related U.S. Application Data

(60) Division of application No. 09/360,102, filed on Jul. 23, 1999, now abandoned, and a continuation-in-part of application No. 09/304,143, filed on May 3, 1999, which is a continuation-in-part of application No. 08/915,661, filed on Aug. 21, 1997.

(51) Int. Cl.$^7$ .................................................. H01L 21/76
(52) U.S. Cl. ...................... 438/424; 438/221; 438/223; 438/224; 438/296; 438/433; 438/434
(58) Field of Search ................................. 438/424, 433, 438/434, 435, 207, 218, 219, 221, 223, 224, 294, 296

(56) References Cited

U.S. PATENT DOCUMENTS

| | | | |
|---|---|---|---|
| 4,923,821 | * 5/1990 | Namose | 438/425 |
| 5,316,965 | * 5/1994 | Philipossian et al. | 438/424 |
| 5,539,229 | * 7/1996 | Noble, Jr. et al. | 257/301 |
| 6,046,088 | * 4/2000 | Klein et al. | 438/296 |
| 6,069,058 | * 5/2000 | Hong | 438/436 |
| 6,133,105 | * 10/2000 | Chen et al. | 438/296 |
| 6,184,105 | * 2/2001 | Liu et al. | 438/424 |

\* cited by examiner

Primary Examiner—John F. Niebling
Assistant Examiner—Lynne A. Gurley

(57) ABSTRACT

A method for fabricating a semiconductor device. A shallow trench isolation is formed by forming a well region, a gate oxide layer and a wiring layer prior to forming a trench in the substrate. The trench is then filled with silicon oxide layer doped with germanium, nitrogen, titanium or other refractory metal. In addition, a MOS device is also fabricated with a gate buried in the substrate with a shallow trench isolation filled with the doped silicon oxide layer formed therein.

3 Claims, 4 Drawing Sheets

METHOD OF FABRICATING A SHALLOW TRENCH ISOLATION SEMICONDUCTOR DEVICE

CROSS-REFERENCE TO RELATED APPLICATION

This ia a Divisional application Ser. No. 09/360,102 filed on Jul. 23, 1999, now abandoned.

This application is a continuation-in-part of prior applications Ser. No. 08/915,661, filed Aug. 21, 1997 and Ser. No. 09/304,143, filed May 3, 1999.

BACKGROUND OF THE INVENTION

1. Field of the Invention

The invention relates in general to a method of fabricating a semiconductor device. More particularly, this invention uses a method of fabricating a metal oxide semiconductor (MOS) with a gate formed in an active region of a substrate isolated by an isolation structure filled with doped insulation material.

2. Description of the Related Art

Shallow trench isolation is currently a wide applied isolation structure in integrated circuit. The demand of fabricating an integrated circuit with a high integration has made the elements, including the isolation structures and devices such as metal-oxide semiconductors (MOS), formed on a semiconductor substrate become smaller and smaller.

In the conventional method for fabricating a shallow trench isolation, a pad oxide is formed on a substrate prior to forming a trench followed by filling the trench with an undoped insulation material. The pad oxide layer is then removed after the trench is filled, and a gate oxide layer is formed on the substrate. It is very often that the substrate is damaged during the removal of the pad oxide layer. Or the pad oxide layer can be removed improperly to cause a poor integrity of the gate oxide layer formed subsequently. This seriously affects the device reliability.

In addition, by filling the trench with an undoped insulation material, a great difference in thermal expansion coefficient and Young's modulus is induced between the substrate and the undoped insulation material filled within the trench. As a consequence, the substrate is experience a stress during any subsequent thermal process to cause physical defects such as the deformation of the undoped insulation material. A junction leakage and a sub-threshold leakage are thus very likely to be induced.

Other problems due to the size reduction of semiconductor devices include the well-known "short channel effect". A variety of methods have been proposed to resolve this problem. However, the shrinkage of a MOS device consequently has a reduced gate length and it is thus inevitable to cause a punch through between a source region and a drain region.

SUMMARY OF THE INVENTION

The invention provides a method of fabricating a shallow trench isolation as well as a method of fabricating a metal-oxide semiconductor buried in a substrate. In the method of fabricating the shallow trench isolation, a substrate is provided. A gate oxide layer, a first wiring layer and a mask layer are formed on the substrate sequentially. The mask layer is patterned to expose a portion of the first wiring layer under which a trench is to be formed. The exposed first wiring layer, the underlying gate oxide layer and the substrate are etched to form the trench. The trench is filled with a doped silicon oxide layer. The mask layer is then removed, followed by the formation of a second wiring line and a photolithography and etching process on the first and the second wiring layers. Optionally, a well region can be formed prior to the formation of the gate oxide layer.

In the method of fabricating a metal-oxide semiconductor, a substrate having an active region isolated by a shallow trench isolation filled with doped silicon oxide is provided. The substrate may also include a well region formed prior to the formation of the shallow trench isolation. A trench is formed by removing a portion of the substrate in the active region. A spacer and a gate oxide are formed respectively on a sidewall and a bottom surface of the trench. The trench is the filled with a conductive layer to form a gate. Using the gate, the spacer and the shallow trench isolation as a mask, a source/drain region is formed between the shallow trench isolation and the gate. A salicide layer is formed on the source/drain region and the gate.

The method of fabricating a shallow trench isolation with a gate oxide layer formed prior to forming a trench eliminating the problems of damaging the substrate for forming a pad oxide layer followed by a removal step. In addition, an integrity of the gate oxide layer can be obtained since no etch is performed on the required portion of the gate oxide layer. Moreover, the gate oxide layer is covered and thus protected by the lower wiring layer from being damaged according to any external contamination or force. The option of forming a well region prior to the formation of the gate oxide further prevents the gate oxide from being damaged by ion implantation. Furthermore, it is known that while filling the trench with an insulation material, a stress is incurred during a subsequent thermal process due to a large difference in thermal expansion coefficient and Young's modulus between the substrate and the semiconductor. In addition to the deformation of the filling material and other physical defects, a junction leakage and a sub-threshold leakage may also occur. For dense pattern areas and high packing density memory devices, these even cause the devices. Substituting the undoped silicon oxide used in the conventional method with a doped silicon oxide, the thermal expansion coefficient and Young's modulus can be adjusted as specifically required. The stress can thus be suppressed, and consequently, the junction leakage and the sub-threshold leakage which cause devices failure can be eliminated.

The invention also provides a method of fabricating a buried-in metal-oxide semiconductor. A gate is formed buried in the substrate with a spacer or a gate oxide layer isolating the gate from both the source region and the drain region. In this manner, the channel length can be adjusted as required by controlling the depth of the gate, so that the short channel effect can be resolved. Furthermore, the source/drain regions as well as a salicide layer can be formed with a self-aligned manner, so that the reliability is enhanced.

Both the foregoing general description and the following detailed description are exemplary and explanatory only and are not restrictive of the invention, as claimed.

DESCRIPTION OF THE PREFERRED EMBODIMENTS

First Embodiment

FIG. 1A to FIG. 1H shows a first embodiment of the invention. In the first embodiment, a gate oxide layer and a gate conductive layer is formed on a substrate prior to the formation of isolation structure, and the isolation layer is made of doped silicon oxide layer containing dopant such as germanium, nitrogen, titanium, or other refractory metals.

Figure 1A:
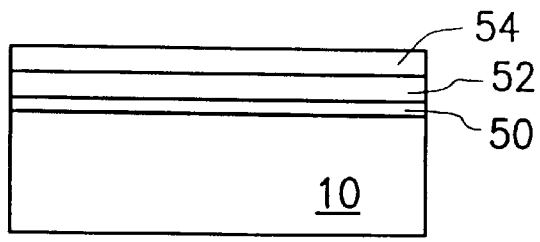
FIG. 1A to FIG. 1H shows an embodiment of fabricating a shallow trench isolation according to the invention.

In FIG. 1A, a gate oxide layer 50 is grown on a substrate 10. The thickness of the gate oxide layer 50 is whatever is required for a metal oxide semiconductor to be formed on the substrate 10. A lowering wiring layer 52 is formed on the gate oxide layer 50 as a protection for the gate oxide layer 50. Therefore, throughout the subsequently steps, the protection allows the gate oxide layer 50 deposited at an initial stage of processing to be a high quality gate oxide layer at the end of the various processing steps required for the formation of the shallow trench isolation region. The lowering wiring layer 52 is often used in the formation of a gate electrode, therefore, the lowering wiring layer 52 is preferably a polysilicon layer formed by, for example, low pressure chemical vapor deposition (LPCVD) to a thickness of about 300–1000 angstroms. The thickness of the lowering wiring layer 52 has to be sufficiently thick to effectively protect the gate oxide layer 50, while to be thin enough for not impeding the subsequent processing step such ion implantation.

Figure 1B:
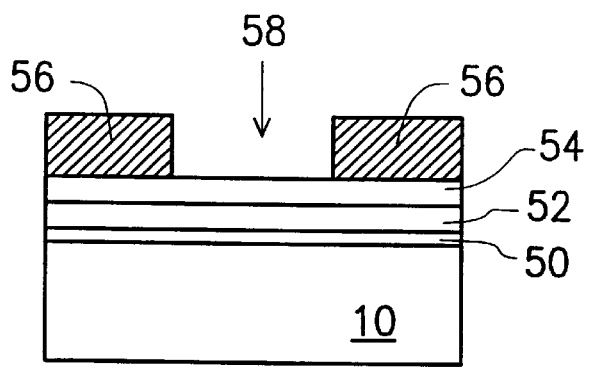

A mask layer 54, for example, a silicon nitride layer with a thickness of about 1000–3000 angstroms, is formed on the lower wiring layer 52 as a protection of the lower wiring layer 52. As shown in FIG. 1B, a photoresist layer 56 is formed on the ask layer 54 with a pattern exposing a portion of the mask layer 54 at a region 58 where a trench is to be formed.

Figure 1C:
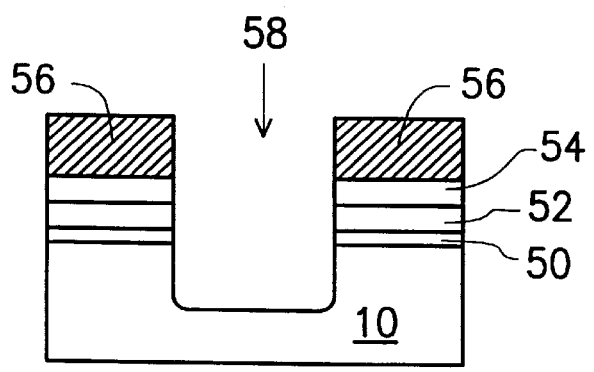

As shown in FIG. 1C, the mask layer 54, the lower wiring layer 52, the gate oxide layer 50, and the substrate 10 at the region 58 are etched to form a trench. The etch process is preferably anisotropic and may be performed by, for example, reactive ion etching. Preferably, the trench for forming a shallow trench isolation may be approximately 4000 angstrom deep. If desired, a thin thermal oxide layer may be grown on sidewall and bottom surface of the trench to remove defects created by the etching process.

Figure 1D:
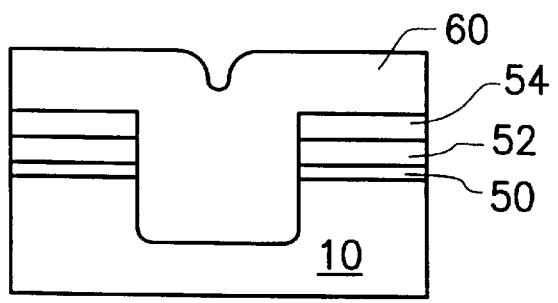

In FIG. 1D, the trench is filled with a doped silicon oxide layer 60 which overflows over the mask layer 54 as well. The doped silicon oxide layer 60 contains the dopant of germanium, nitrogen, titanium or other refractory metals. An annealing process is performed at about 800–950 degree Celsius to densify the doped silicon oxide layer 60.

While dopant of germanium is used, the method for forming the doped silicon oxide layer 60 comprises a low pressure chemical vapor deposition (LPCVD) process or a high density plasma chemical vapor deposition (HDPCVD) process performed at about 250–600 degree Celsius. A mixture of silane ($SiH_4$), germane ($GeH_4$) and oxygen is served as a gas source. During the formation of the doped silicon oxide layer 60, germane reacts with oxygen to produce germanium oxide ($GeO_2$). The resultant doped silicon oxide layer 60 thus contains germanium oxide. Other method such as a sub-atmosphere chemical vapor deposition (SACVD) process or an atmosphere pressure chemical vapor deposition (APCVD) process is performed at about 250–600 degree Celsius. A mixture of tetraethosiloxane (TEOS) and tetramethoxy germanium ($Ge(OCH_3)_4$) is served as a gas source In the process, tetraethosiloxane is used as a precursor for forming germanium oxide.

While nitrogen is used as the dopant for the doped silicon oxide layer 60, ammonia, nitrogen monoxide ($N_2O$) or nitrogen is added into a gas source for the deposition process. While a refractory metal such as titanium is used as the dopant, tetraethoxy titanium ($Ti(OC_2H_5)_4$) is added.

By filling the trench with a doped silicon oxide layer 60 instead of the conventional undoped silicon oxide layer, thermal expansion coefficient and Young's modulus can be adjusted to reduce the stress incurred during a subsequent thermal process such as an annealing process by controlling the dopant. Junction leakage and sub-threshold leakage are both reduced.

It is known that glass transition temperature of silicon oxide is also dependent on the dopants. For example, glass transition temperature of doped silicon oxide can be reduced from about 1160 degree Celsius to about 800 degree Celsius while the more percentage of germanium oxide in the doped silicon oxide reaches about 4%. As a result, the annealing temperature can be performed at a lower temperature compared to the conventional undoped silicon oxide for densification. As the temperature of annealing is reduced, less stress occurs.

To use a hydrofluoric acid for etching, the doped silicon oxide has a different etching rate from that of the undoped silicon oxide. For example, the hydrofluoric acid etching rate of germanium oxide is lower than that of silicon oxide. Therefore, the dopant prevents from losing material during a dipping process, so that a kink effect is eliminated. Another advantage of the doped silicon oxide is a better step coverage, especially for those trenches with a narrow width but a deep profile.

Figure 1E:
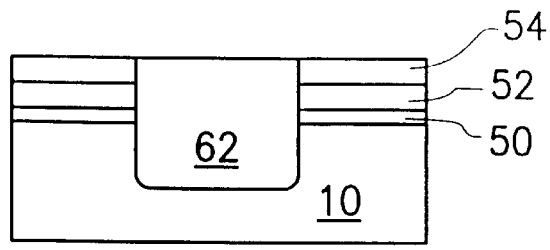
Figure 1F:
Figure 1F:
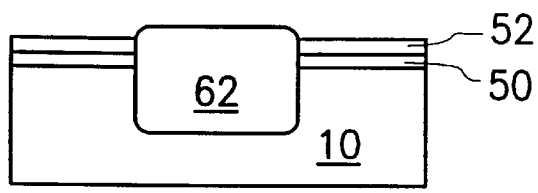

In FIG. 1E, the doped silicon oxide layer 60 over a surface level of the mask layer 54 is removed, preferably by chemical mechanical polish (CMP). The mask layer 54 is used as a polishing stop. The mask layer 54 is then removed to expose the lower wiring layer 52 as shown in FIG. 1F. At this stage, well implantation and channel implantation can be made through the lower wiring layer 50 and the oxide layer 50. For well implantation, boron or phosphorus ions can be implanted through layers 52 and 54 into the substrate 10 with an energy and at dosages appropriate to the particular devices to be formed.

Figure 1G:
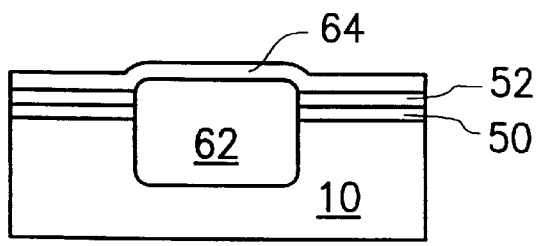
Figure 1H:
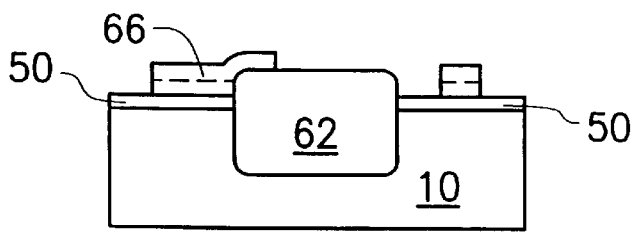

In FIG. 1G, an upper wiring layer 64, for example, a polysilicon layer, is formed on the lower wiring layer 64. When the lower and upper wiring layers 52 and 64 are made of polysilicon, impurity such as phosphorus is implanted. In FIG. 1H, the upper wiring layer 64 and the lower wiring layer 52 are pattern to form required conductive line or gate electrode denoted as 66.

Second embodiment

Figure 2A:
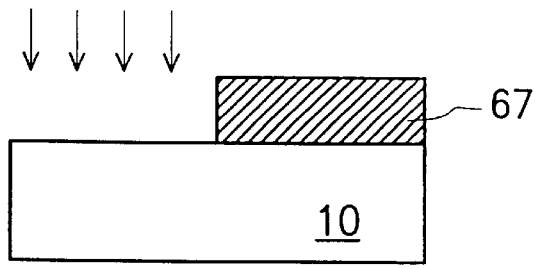
FIG. 2A to FIG. 2B shows modification of the shallow trench isolation formed as shown in FIG. 1A to FIG. 1H; and FIG. 3A to FIG. 3F shows a fabricating process of a metal-oxide semiconductor with a gate buried in a substrate.
Figure 2B:
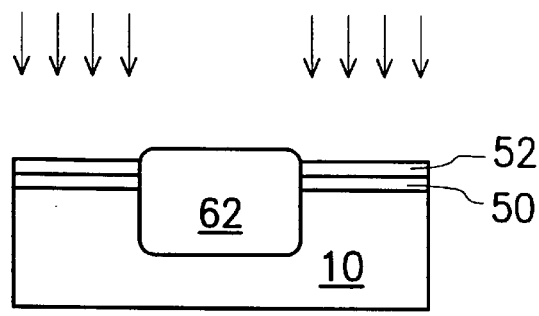

FIG. 2A to FIG. 2B accompanied with FIG. 1B to FIG. 1H shows a modification of the first embodiment. Referring to FIG. 2A, the same as the first embodiment, a substrate 10 is provided. A photoresist layer 67 is formed to cover a portion of the substrate 10. An ion implantation step is performed for forming a well region using the photoresist layer 67 as an implantation mask. After implantation, the photoresist layer 67 is removed. It is believed that performing the well implantation step prior to the formation of a gate oxide layer can enhance the gate oxide quality since high energy implantation through the gate oxide layer tends to damage the oxide.

The following processing steps can be referred to FIG. 1B to FIG. 1E which are not to be introduced again herewith. After a structure as shown in FIG. 1E is formed, the mask layer 54 is removed. Channel implantation, as shown in FIG. 2B, including a threshold adjust implantation, can be made through the polysilicon layer 50, followed by a rapid thermal annealing step.

An upper wiring layer 64 is formed on the lower wiring layer 52 as shown in FIG. 1G, followed by patterning the upper wiring layer 64 and the lower wiring layer 52 as shown in FIG. 1H. Similar to the first embodiment, the material filled in the shallow trench isolation is silicon oxide doped with germanium, nitrogen, titanium or other refractory metals. The formation and advantages of the doped silicon oxide are the same as those of the first embodiment.

Third Embodiment

Figure 3A:
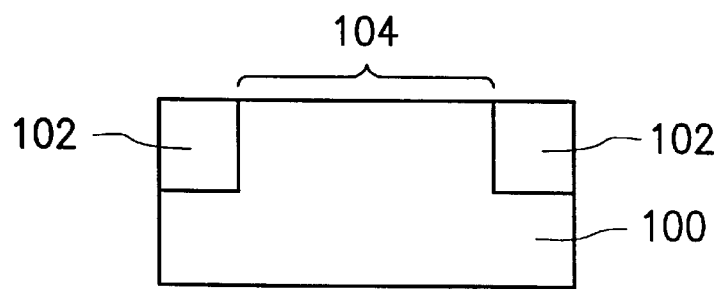

As shown in FIG. 3A, a semiconductor substrate 100 comprising a shallow trench isolation 102 isolating an active region 104 is provided. Within the shallow trench isolation 102, a silicon oxide layer doped with dopant such as germanium, nitrogen, titanium, or other refractory metals is formed. The active region 104 may comprise a doped well formed prior to or after the formation of the shallow trench isolation 120. The fabrication method and advantages of the doped silicon oxide layer within the shallow trench isolation 102 can be referred to the first and the second embodiment, while the doped well is formed in a similar manner as the second embodiment.

Figure 3B:
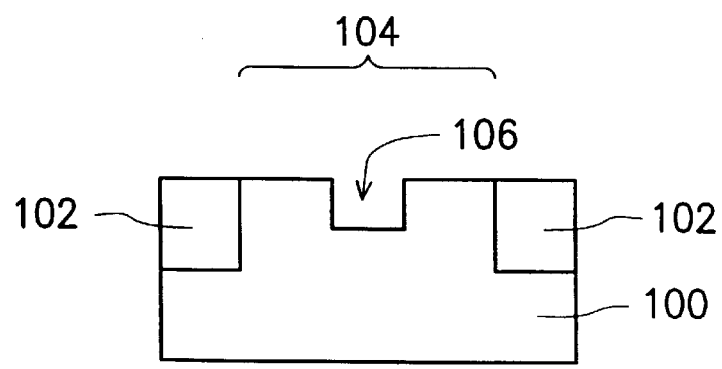

In FIG. 3B, the substrate 100 in the active region 104 is etched to form a trench 106. The depth of the trench 106 is whatever is required for a gate of a metal oxide semiconductor to be formed in the active region 104 in the subsequent processes.

Figure 3C:
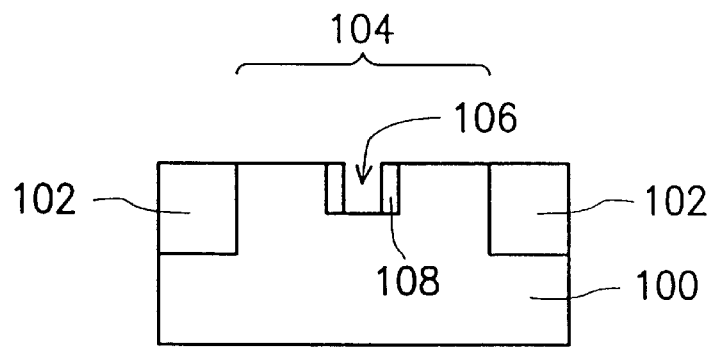

In FIG. 3C, a spacer 108 is formed on a sidewall of the trench 106. The method of forming spacer 108 includes depositing an insulation layer, for example, a silicon nitride layer, over the substrate 100 and in the trench 106. The insulation layer is etched back to leave only a portion covering the sidewall of the trench 106 to serve as a spacer 108.

Figure 3D:
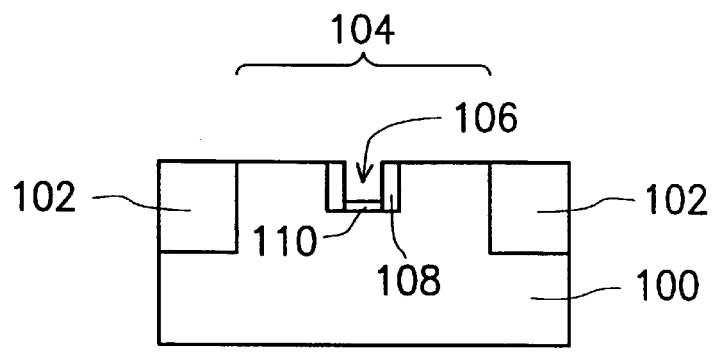

In FIG. 3D, a gate oxide layer 110 is formed on a bottom surface of the trench 106. The method of forming the gate oxide layer 10 includes, for example, a thermal oxidation step. In this embodiment, the spacer 108 is formed prior to forming the gate oxide layer 110. It is appreciated that the sequence can also be reversed according to specific process requirement. Alternatively, the spacer 108 and the gate 110 can also be formed with same material or in a same process step.

Figure 3E:
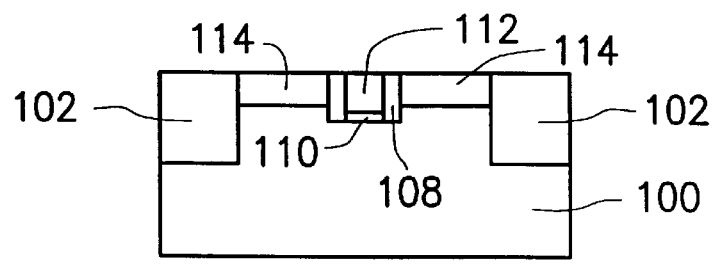

In FIG. 3E, the trench 106 is filled with a conductive layer, for example, a polysilicon layer, serving as a gate electrode 112. To form the gate electrode 112, the conductive layer is formed to fill the trench 106 and overflow over the substrate 100. Using etch back or chemical mechanical polishing (CMP), the conductive layer over a surface level of the substrate 100 is removed until the substrate 100 is exposed. The material of the conductive layer comprises, for example, polysilicon.

Using the gate electrode 112 and the shallow trench isolation 102 as a mask, source/drain regions 114 can be formed in the substrate 100 at two sides of the gate electrode 112 in a manner of self-alignment.

Figure 3F:
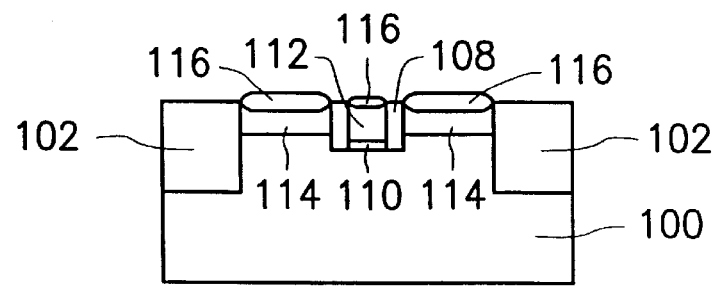

In FIG. 3F, a self-aligned silicidation step is performed. A refractory metal layer is formed on the substrate 100. A thermal process is performed to have the refractory metal reacted with semiconductor atoms of the substrate 100, so that a salicide layer 116 is formed to cover the gate 112 and the source/drain region 114. The unreacted refractory metal is then removed. As a result, only those surfaces containing semiconductor atoms, for example, the source/drain region 114 and the gate 112 are covered by the salicide layer 116, while the spacer 108 and the shallow trench isolation 102 are remained exposed after the removal of the unreacted refractory metal layer.

In addition to the embodiment disclosed above, the third embodiment for fabricating a MOS device can also be formed in a well region which is formed prior to the formation of the shallow trench isolation. The process flow is similar to that shown in FIG. 2A, followed by FIGS. 3A to FIG. 3F.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a shallow trench isolation in a substrate, comprising:

implanting ions into the substrate to form at least a well;

forming a gate oxide layer on the substrate after the formation of the well;

forming a first wiring layer on the gate oxide layer;

forming a trench in the substrate through the first wiring layer and the gate oxide layer;

forming a silicon oxide layer doped with nitrogen, germanium, titanium or other refractory metals to fill the trench; and patterning the first wiring layer and the gate oxide layer.

2. A method of fabricating a shallow trench isolation in a substrate, comprising:

implanting ions into the substrate to form at least a well;

forming a gate oxide layer on the substrate after the formation of the well;

forming a first wiring layer on the gate oxide layer;

forming a trench in the substrate through the first wiring layer and the gate oxide layer;

forming a silicon oxide layer doped with nitrogen, germanium, titanium or other refractory metals to fill the trench, wherein the silicon oxide layer's dopant concentration level is controlled so as to have a thermal expansion coefficient and a Young's modulus comparable to the substrate; and patterning the first wiring layer and the gate oxide layer.

3. A method of fabricating a shallow trench isolation in a substrate, comprising:

implanting ions into the substrate to form at least a well;

forming a gate oxide layer on the substrate after the formation of the well;

forming a first wiring layer on the gate oxide layer;

forming a trench in the substrate through the first wiring layer and the gate oxide layer;

forming a silicon oxide layer doped with nitrogen, germanium, titanium, or other refractory metals to fill the trench, wherein a glass transition temperature of the silicon oxide is reduced to allow for a lower temperature for an annealing process; and patterning the first wiring layer and the gate oxide layer.

* * * * *